United States Patent
Chen et al.

(10) Patent No.: US 12,525,992 B2
(45) Date of Patent: Jan. 13, 2026

(54) LOW-DENSITY PARITY-CHECK DECODER

(71) Applicant: NEWSOUTH INNOVATIONS PTY LIMITED, Sydney (AU)

(72) Inventors: Jinyu Chen, Sydney (AU); Jinhong Yuan, Sydney (AU); Yixuan Xie, Sydney (AU)

(73) Assignee: NEWSOUTH INNOVATIONS PTY LIMITED, Sydney (AU)

( * ) Notice: Subject to any disclaimer, the term of this patent is extended or adjusted under 35 U.S.C. 154(b) by 0 days.

(21) Appl. No.: 18/685,994

(22) PCT Filed: Aug. 22, 2022

(86) PCT No.: PCT/AU2022/050939
§ 371 (c)(1),
(2) Date: Feb. 23, 2024

(87) PCT Pub. No.: WO2023/023712
PCT Pub. Date: Mar. 2, 2023

(65) Prior Publication Data
US 2024/0364364 A1    Oct. 31, 2024

(30) Foreign Application Priority Data
Aug. 23, 2021    (AU) ................................ 2021902647

(51) Int. Cl.
*H03M 13/11* (2006.01)
*H04L 1/00* (2006.01)

(52) U.S. Cl.
CPC ....... *H03M 13/1117* (2013.01); *H04L 1/0063* (2013.01)

(58) Field of Classification Search
CPC ............ H03M 13/1117; H03M 13/112; H03M 13/1105; H03M 13/1111; H03M 13/6502;
(Continued)

(56) References Cited

U.S. PATENT DOCUMENTS 7,752,523 B1 *    7/2010  Chaichanavong ..........................
                                                  H03M 13/1125
                                                        714/755
11,595,060 B2 *   2/2023  Kim ..................... H03M 13/116
(Continued)

FOREIGN PATENT DOCUMENTS

WO       2019213947 A1    11/2019

OTHER PUBLICATIONS

"International Search Report and Written Opinion of the International Searching Authority", International Application No. PCT/AU2022/050939, Oct. 31, 2022, 9 pp.
(Continued)

*Primary Examiner* — Steve N Nguyen
(74) *Attorney, Agent, or Firm* — Myers Bigel, P.A.

(57) ABSTRACT

The present disclosure relates to a method of decoding Low-Density Parity-Check (LDPC) codes in received data. The method comprises determining check nodes, variable nodes, and variable-to-check (VTC) messages based on the LDPC codes. Three or more minimum magnitude values of the determined VTC messages are then determined to obtain a determined minimum VTC message set. A set of check node messages from the determined minimum VTC message set is also determined, wherein the determined set of check node messages and the determined minimum VTC message set are used to determine a set of check-to-variable (CTV) messages. The present disclosure also relates to a corresponding method for encoding.

15 Claims, 7 Drawing Sheets

(58) Field of Classification Search
CPC .............. H03M 13/6569; H04L 1/0063; G06F 11/1012; G06F 11/1004
See application file for complete search history.

(56) References Cited

U.S. PATENT DOCUMENTS

| | | | |
|---|---|---|---|
| 2005/0138519 A1* | 6/2005 | Boutillon | H03M 13/1117 714/752 |
| 2005/0229087 A1 | 10/2005 | Kim et al. | |
| 2005/0240647 A1* | 10/2005 | Banihashemi | H03M 13/1105 708/800 |
| 2007/0089018 A1* | 4/2007 | Tang | H03M 13/1122 714/752 |
| 2008/0212549 A1 | 9/2008 | Park et al. | |
| 2010/0325514 A1* | 12/2010 | Sugihara | H03M 13/112 714/752 |
| 2011/0075287 A1 | 3/2011 | Risso et al. | |
| 2011/0142181 A1 | 6/2011 | Leshem et al. | |
| 2013/0061107 A1* | 3/2013 | Wang | H03M 13/658 714/752 |
| 2013/0254628 A1* | 9/2013 | Kim | G06F 11/1044 714/763 |
| 2016/0055057 A1* | 2/2016 | Shin | G06F 11/1012 714/764 |
| 2018/0013446 A1 | 1/2018 | Milicevic et al. | |
| 2018/0062666 A1* | 3/2018 | Zhang | H03M 13/1122 |
| 2018/0287637 A1* | 10/2018 | Liu | H03M 13/112 |
| 2019/0097656 A1 | 3/2019 | Bhatia et al. | |
| 2020/0336156 A1* | 10/2020 | Kim | H03M 13/114 |

OTHER PUBLICATIONS

Mankar, Monica V., et al., "Single mode Quasi-cyclic LDPC Decoder Using Modified Belief Propagation", 2014 International Conference on Communication and Signal Processing, Melmaruvathur, India, Apr. 3, 2014, pp. 862-866.

* cited by examiner $$H = \begin{bmatrix} 1 & 1 & 1 & 1 & 0 & 0 & 0 & 0 & 0 \\ 1 & 0 & 0 & 0 & 1 & 1 & 1 & 0 & 0 \\ 0 & 1 & 0 & 0 & 1 & 0 & 0 & 1 & 1 & 0 \\ 0 & 0 & 1 & 0 & 0 & 1 & 0 & 1 & 0 & 1 \\ 0 & 0 & 0 & 1 & 0 & 0 & 1 & 0 & 1 & 1 \end{bmatrix}$$

LOW-DENSITY PARITY-CHECK DECODER

TECHNICAL FIELD

The present invention generally relates to error correction coding for information transmission, data storage and signal processing systems, such as wired and wireless digital communication systems, flash memories and other memories, and storage drive systems. More particularly, the present invention relates to a decoding method and, in particular, a method of decoding low-density parity-check (LDPC) codes. The present invention also relates to a computer program product, including a computer-readable medium having recorded thereon a computer program for decoding LDPC codes.

BACKGROUND

Digital communication enables two devices to exchange information (e.g., data, voice, video, etc.). However, the channel (e.g., liquid, cable, air, etc.), on which such digital communication is conducted, is typically noisy and introduces errors into the transmitted information. FIG. 1A shows an illustration of a digital communication system 100 having a source 110 and a sink 120 communicating via a channel 130. The source 110 transmits data through the channel 130 to the sink 120. One example of channel 130 is air, which is the medium of wireless communication. As the transmitted data travel through the channel 130, errors may be introduced into the transmitted data. An example of such errors is the corruption of a transmitted bit (e.g., from bit 1 to bit 0).

In one solution, the data transmitted by the source 110 is encoded to enable any errors that occurred during the transmission to be detected and corrected. Such an encoding is called a forward error correction (FEC) coding. The encoding involves adding redundancy to the source data. When the encoded data is received by the receiver, the source data is recovered by performing decoding to correct any corrupted data. The recovered source data is then provided to the sink 120.

FIG. 1B shows an illustration of FEC coding. The source 110 transmits the data to a source encoder 112. The source encoder 112 then transforms the source data into bit streams. The source encoder 112 compresses the source data into a smaller number of bits that need to be transmitted. The bit streams generated by the source encoder 112 are then transmitted to a channel encoder 114.

The channel encoder 114 encodes the bit streams (generated by the source encoder 112) by adding redundant bits into the bit streams. The redundant bits enable the source data to be recovered at the receiver, even if the bit streams are corrupted during transmission via the channel 130. The encoded bit streams (having the redundant bits) are then transmitted via the channel 130.

The received encoded data (i.e., encoded bit streams) is then processed by a channel decoder 124 to detect and correct any errors in the encoded data. Once the errors are corrected, the data is sent to a source decoder 122. The source decoder 122 converts the bit streams back into the source data. The source data is then provided to the sink 120.

One FEC coding uses Low-Density Parity-Check (LDPC) codes, which are a type of linear block codes. The LDPC codes are decoded by the channel decoder 124.

An LDPC code produces parity data as the redundancy that is in the form of a binary matrix H with elements of 1 or 0. As the name LDPC suggests, the matrix H has a low density, meaning that there are more 0s than 1s. The low-density nature of the matrix H reduces complexity and makes it easier to implement the encoding and decoding of LDPC codes. The low-density nature of LDPC codes also ensures effective iterative decoding of LDPC codes.

The matrix H has two parameters, namely a row degree and a column degree. The row degree indicates the number of 1 in a row of the matrix H. The column degree indicates the number of 1 in a column of the matrix H.

LDPC codes are categorized into a regular or an irregular LDPC code. A regular LDPC code has the same row degree for each of the rows of the matrix H, and has the same column degree for each of the columns of the matrix H. An irregular LDPC code has varying row degrees for the rows of the matrix H, and has varying column degrees for the columns of the matrix H.

FIG. 2A is an example matrix H of a regular LDPC with a row degree of 4 and a column degree of 2. An LDPC code can be represented by a Tanner graph consisting of nodes and edges. FIG. 2B shows a Tanner graph 200 representing the matrix H shown in FIG. 2A. The Tanner graph 200 has check nodes 210A to 210E, variable nodes 220A to 220J, and edges 230.

Hereinafter, check nodes 210A to 210E will be collectively referred to as check nodes 210 (when referring to all the check nodes) or check node 210 (when referring to one check node). Hereinafter, variable nodes 220A to 220J will be collectively referred to as variable nodes 220 (when referring to all the variable nodes) or variable node 220 (when referring to one variable node).

Only one of the edges 230 has been indicated with the reference numeral 230 for simplicity sake. Similar to the check nodes 210 and variable nodes 220, the edges 230 will be collectively referred to as edges 230 (when referring to all the edges) or edge 230 (when referring to one edge).

Each of the check nodes 210 relates to each row of the matrix H. For example, check node 210A relates to the first row of the matrix H, while check node 210B relates to the second row of the matrix H, and so on.

Each of the variable nodes 220 relates to each column of the matrix H. For example, variable node 220A relates to the first column of the matrix H, while variable node 220B relates to the second column of the matrix H, and so on.

A check node 210 is connected to a variable node 220 by an edge 230 when there is an element 1 in the corresponding entry in the matrix H. For example, check node 210A (representing the first row of matrix H) is connected by an edge 230 to variable node 220A as the matrix H has an element 1 in the first row and first column of the matrix H.

Each check node 210 has a check node degree $d_c$ indicating the number of variable nodes 220 to which the particular check node 210 is connected. For example, check node 210A has a check node degree $d_c$ of 4, as check node 210A is connected to variable nodes 220A to 220D.

Similarly, each variable node 220 has a variable node degree $d_v$ indicating the number of check nodes 210 to which the particular variable node 220 is connected. For example, variable node 220A has a variable node degree $d_v$ of 2, as variable node 220A is connected to check nodes 210A and 210B.

In other words, whenever there is an element 1 at row j and column i, there is an edge 230 connecting the corresponding check node 210 of row j and the corresponding variable node 220 of column i.

Turning back to FIG. 1B, the encoded data sent by the channel encoder 114 via the channel 130 includes bits $x_i$ (where i=1 to n), where bits $x_i$ are received as received signal $y_i$ at the receiver (i.e., channel decoder 124). The receiver can then, based on the received signal $y_i$, calculate the probability that a bit $x_i$ is an element 0 (i.e., $p(x_i=0|y_i)$) and a corresponding probability that a bit $x_i$ is an element 1 (i.e., $p(x_i=1|y_i)$).

The log-likelihood ratio (LLR), denoted as $r_i$, of each of bits $x_i$ can then be calculated using the equation $$r_i = \log\left(\frac{p(x_i = 0|y_i)}{p(x_i = 1|y_i)}\right).$$

The channel decoder 124 receives the signal $y_i$ (where i=1 to n) and calculates the corresponding LLR $r_i$. Each of the LLR $r_i$ is then assigned to a variable node 220, which in turn connects to one or more check nodes 210 via edges 230. As discussed hereinbefore, the connection between check nodes 210 and variable nodes 220 is determined by the matrix H of the LDPC codes.

FIG. 3 shows a Tanner graph 300 of an example of encoded data having 4 bits $x_i$ (where i=4). The matrix H related to the encoded data is a 1×4 matrix, where the row j=1 is [1 1 1 1]. The matrix H shown in this example does not follow the requirements of LDPC codes for simplicity sake and to show the messages transmitted between check nodes 210 and variable nodes 220. According to the matrix H, the Tanner graph 300 has one check node 210A, four variable nodes 220A to 220D (corresponding to i=4), and edges 230. In Tanner graph 300, the check node 210A connects to each of the variable nodes 220A to 220D via edges 230. Tanner graph 300 also shows that there are variable-to-check (VTC) messages $Z_{j,i}$ being sent from a variable node 220 to a connected check node 210. Further, Tanner graph 300 shows that there are check-to-variable (CTV) messages $E_{j,i}$ being sent from check node 210 to a connected variable node 220.

Each of the variable nodes 220 has an LLR value that is the sum of the LLR (i.e., $r_i$) of the corresponding bit $x_i$ assigned to that variable node 220 and the CTV messages $E_{j,i}$ from check nodes 210 to which that variable node 220 is connected. An equation of the LLR value of a variable node 220 is:

$$L_i = r_i + \sum_{j \in A_i} E_{j,i}$$

VTC messages $Z_{j,i}$ are calculated by $$Z_{j,i} = r_i + \sum_{j' \in A_i, j' \neq j} E_{j',i}$$

where $Z_{j,i}$ is a VTC message from the $i^{th}$ variable node 220 to the $j^{th}$ check node 210; $A_i$ is the set of check nodes 210 connected to the $i^{th}$ variable node 220. The variable node 220 at the $i^{th}$ index calculates all the VTC messages $Z_{j,i}$ to be sent by the variable node 220 at the $i^{th}$ index. The calculated VTC messages $Z_{j,i}$ are sent to check nodes 210 (to which the variable node 220 at the $i^{th}$ index is connected).

The VTC message $Z_{j,i}$ being calculated by the $i^{th}$ variable node 220 for the $j^{th}$ check node 210 is effectively the updated LLR (i.e, $L_i$) of the $i^{th}$ variable node 220 subtracted by the CTV message $E_{j,i}$ received from the $j^{th}$ check node 210. The calculation removes self-information. Self-information is the information sent by the $j^{th}$ check node 210.

Similar to the calculation of the VTC message $Z_{j,i}$, the check node 210 at the $j^{th}$ index calculates all the CTV messages $E_{j,i}$ to be sent by the check node 210 at the $j^{th}$ index to the $i^{th}$ variable node 220. The calculated CTV messages $E_{j,i}$ are sent to all $i^{th}$ variable nodes 220, to which the check node 210 at the $j^{th}$ index is connected.

The CTV messages $E_{j,i}$ can be calculated with a belief propagation (BP) algorithm known as the sum-product algorithm (SPA). SPA uses a non-linear hyperbolic function to calculate the CTV messages $E_{j,i}$. The function is:

$$E_{j,i} = \prod_{i' \neq i, i' \in B_j} \text{sgn}(Z_{j,i'}) \cdot \theta\left(\sum_{i' \neq i, i' \in B_j} \theta(Z_{j,i'})\right)$$

$$\theta(x) = -\log\tanh(x/2)$$

where $E_{j,i}$ is a CTV message from the $j^{th}$ check node 210 to the $i^{th}$ variable node 220; $B_j$ is the set of variable nodes 220 connected to the $j^{th}$ check node 210; and $\text{sgn}(Z_{j,i'})$ is a function for determining the sign for $Z_{j,i'}$ such that if $Z_{j,i} \geq 0$ then $\text{sgn}(Z_{j,i})=1$. Otherwise, $\text{sgn}(Z_{j,i})=-1$.

Once all the CTV messages $E_{j,i}$ are generated, the LLR value $L_i$ of each bit is computed based on the equation $$L_i = r_i + \sum_{j \in A_i} E_{j,i}$$

discussed above. When $L_i \geq 0$ then $\bar{x}_i=0$ and when $L_i<0$ then $\bar{x}_i=1$. The sequence $\bar{x}=[\bar{x}_1, \bar{x}_2, \bar{x}_3 \ldots \bar{x}_n]$ is known as the decoded bits. The decoding process terminates if all parity check equations are satisfied, which is represented by the equation:

$$H \cdot \bar{x}^T = 0,$$

where H is the parity check matrix, $\bar{x}^T$ is the transpose of the decoded bits, and 0 is the all-zero vector. Hence, the channel decoder 124 determines an error-free sequence when this equation is satisfied. Otherwise, the decoding process restarts as outlined above.

However, the above SPA calculation is complex and requires a high computing resources to determine all the CTV messages $E_{j,i}$.

Accordingly, there is a need to provide a decoding method that is lower in complexity and requires fewer computing resources.

SUMMARY

It is an object of the present invention to substantially overcome, or at least ameliorate, one or more disadvantages of existing arrangements.

According to one aspect of the present disclosure, there is provided a method of decoding Low-Density Parity-Check (LDPC) codes in received data, the method comprising: determining check nodes, variable nodes, and variable-to-check (VTC) messages based on the LDPC codes; determining three or more minimum magnitude values of the determined VTC messages to obtain a determined minimum VTC message set; and determining a set of check node messages from the determined minimum VTC message set, wherein the determined set of check node and the determined minimum VTC message set messages are used to determine a set of check-to-variable (CTV) messages.

According to another aspect of the present disclosure, there is provided an apparatus for implementing any one of the aforementioned methods.

According to another aspect of the present disclosure, there is provided a computer program product including a computer-readable medium having recorded thereon a computer program for implementing any one of the methods described above.

Other aspects are also disclosed.

BRIEF DESCRIPTION OF THE DRAWINGS

Some aspects of the prior art and at least one embodiment of the present invention will now be described with reference to the drawings and appendices, in which.

DETAILED DESCRIPTION

Figure 1A:
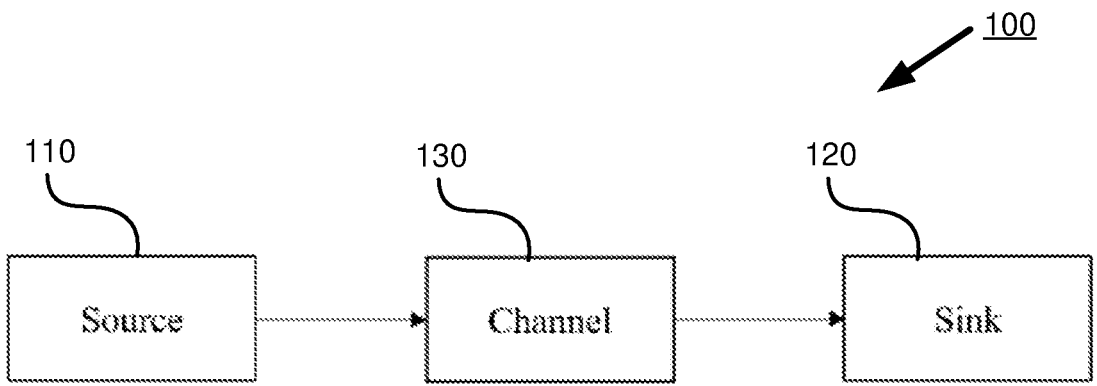
FIG. 1A shows communication between a source and a sink using digital communication.

Where reference is made in any one or more of the accompanying drawings to steps and/or features, which have the same reference numerals, those steps and/or features have for the purposes of this description the same function(s) or operation(s), unless the contrary intention appears.

It is to be noted that the discussions contained in the "Background" section and that above relating to prior art arrangements relate to discussions of documents or devices which form public knowledge through their respective publication and/or use. Such should not be interpreted as a representation by the present inventor(s) or the patent applicant that such documents or devices in any way form part of the common general knowledge in the art.

Computer Description

Figure 6A:
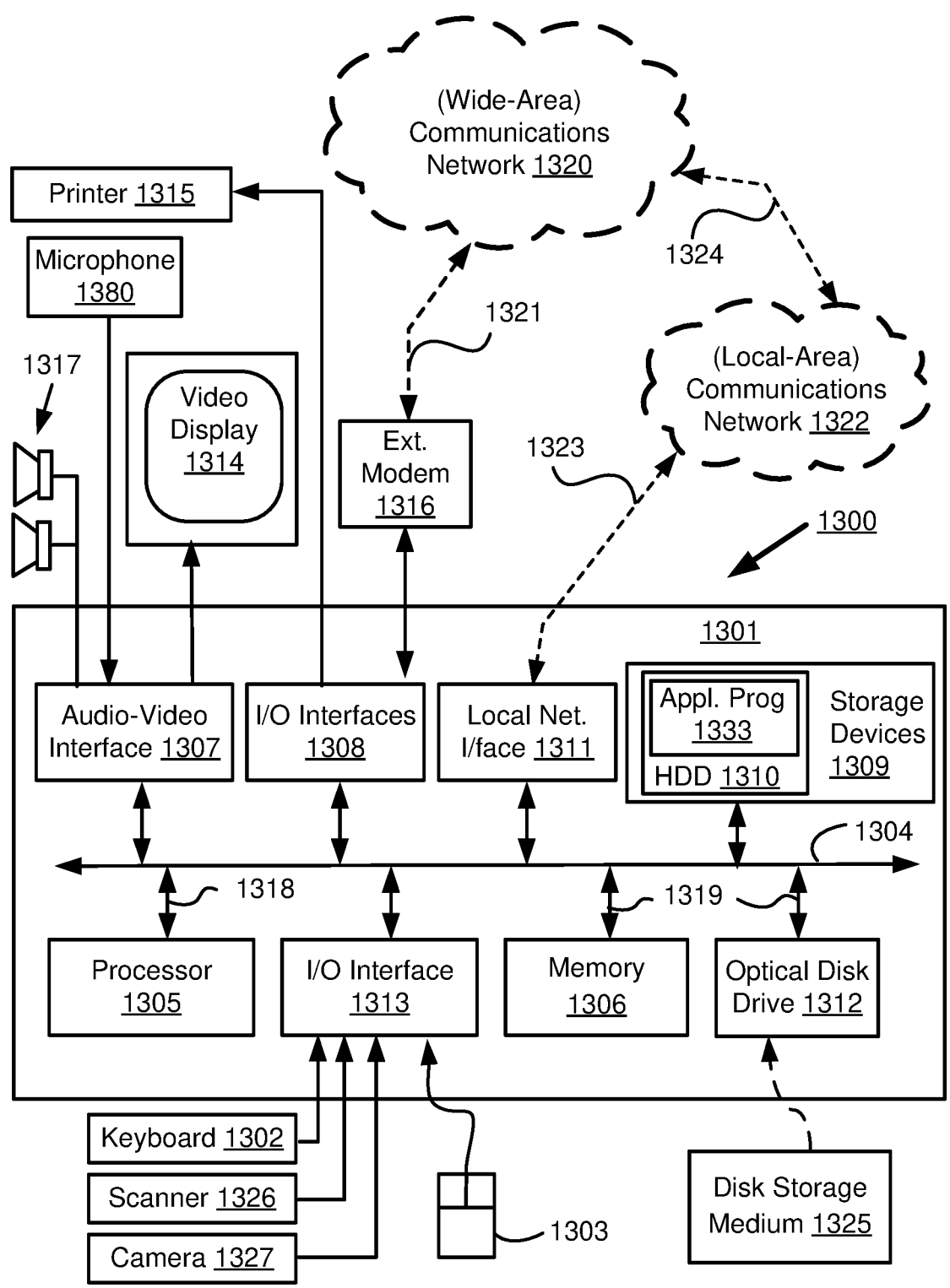
FIGS. 6A and 6B form a schematic block diagram of a general-purpose computer system upon which arrangements described can be practiced.
Figure 6B:
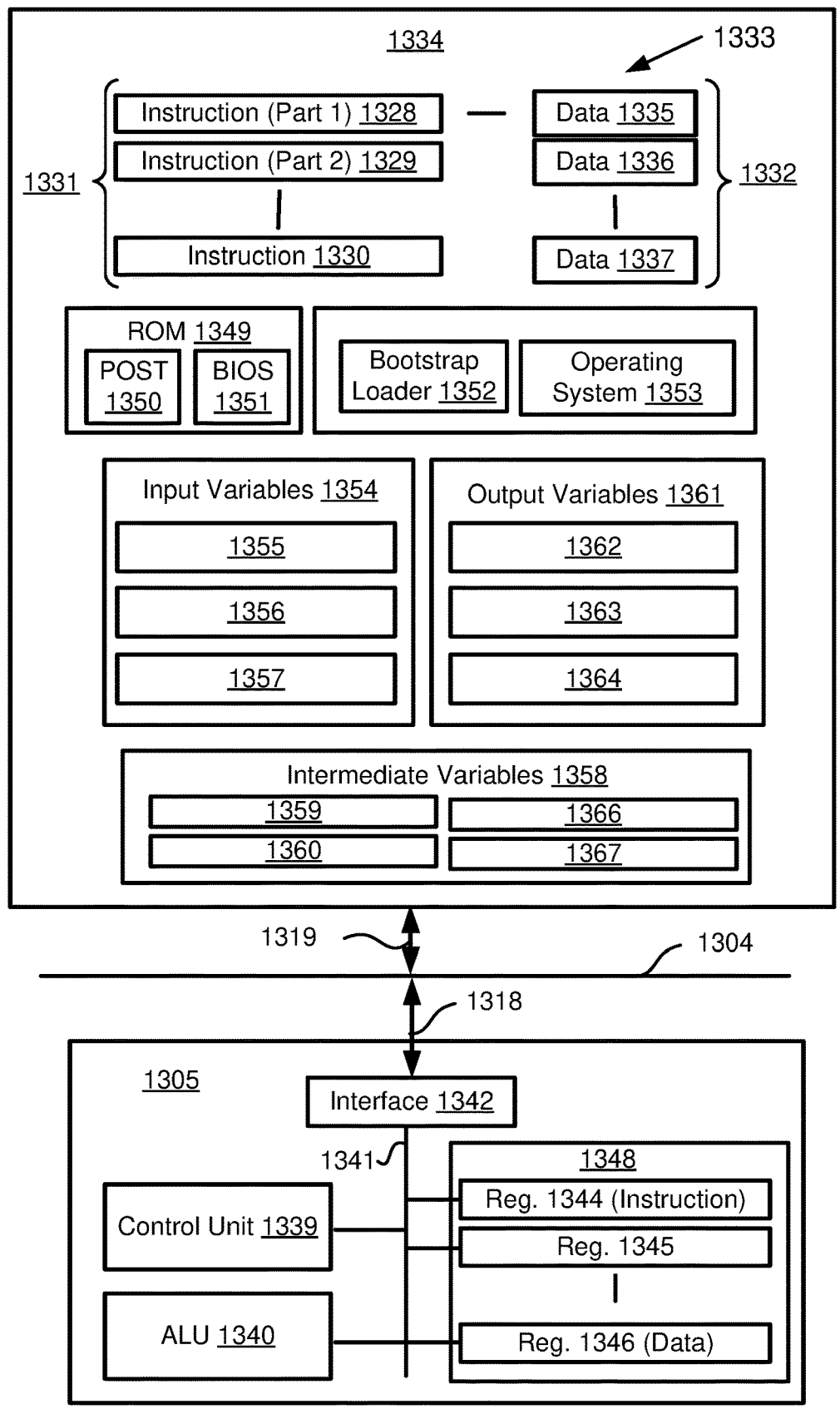

FIGS. 6A and 6B depict a general-purpose computer system 1300, upon which the various arrangements described can be practiced.

As seen in FIG. 6A, the computer system 1300 includes: a computer module 1301; input devices such as a keyboard 1302, a mouse pointer device 1303, a scanner 1326, a camera 1327, and a microphone 1380; and output devices including a printer 1315, a display device 1314 and loudspeakers 1317. An external Modulator-Demodulator (Modem) transceiver device 1316 may be used by the computer module 1301 for communicating to and from a communications network 1320 via a connection 1321. The communications network 1320 may be a wide-area network (WAN), such as the Internet, a cellular telecommunications network, or a private WAN. Where the connection 1321 is a telephone line, the modem 1316 may be a traditional "dial-up" modem. Alternatively, where the connection 1321 is a high capacity (e.g., cable) connection, the modem 1316 may be a broadband modem. A wireless modem may also be used for wireless connection to the communications network 1320.

The computer module 1301 typically includes at least one processor unit 1305, and a memory unit 1306. For example, the memory unit 1306 may have semiconductor random access memory (RAM) and semiconductor read only memory (ROM). The computer module 1301 also includes a number of input/output (I/O) interfaces including: an audio-video interface 1307 that couples to the video display 1314, loudspeakers 1317 and microphone 1380; an I/O interface 1313 that couples to the keyboard 1302, mouse 1303, scanner 1326, camera 1327 and optionally a joystick or other human interface device (not illustrated); and an interface 1308 for the external modem 1316 and printer 1315. In some implementations, the modem 1316 may be incorporated within the computer module 1301, for example within the interface 1308. The computer module 1301 also has a local network interface 1311, which permits coupling of the computer system 1300 via a connection 1323 to a local-area communications network 1322, known as a Local Area Network (LAN). As illustrated in FIG. 6A, the local communications network 1322 may also couple to the wide network 1320 via a connection 1324, which would typically include a so-called "firewall" device or device of similar functionality. The local network interface 1311 may comprise an Ethernet circuit card, a Bluetooth® wireless arrangement or an IEEE 802.11 wireless arrangement; however, numerous other types of interfaces may be practiced for the interface 1311.

The I/O interfaces 1308 and 1313 may afford either or both of serial and parallel connectivity, the former typically being implemented according to the Universal Serial Bus (USB) standards and having corresponding USB connectors (not illustrated). Storage devices 1309 are provided and typically include a hard disk drive (HDD) 1310. Other storage devices such as a floppy disk drive and a magnetic tape drive (not illustrated) may also be used. An optical disk drive 1312 is typically provided to act as a non-volatile source of data. Portable memory devices, such as optical disks (e.g., CD-ROM, DVD, Blu-ray Disc™), USB-RAM, portable, external hard drives, and floppy disks, for example, may be used as appropriate sources of data to the system 1300.

The components 1305 to 1313 of the computer module 1301 typically communicate via an interconnected bus 1304 and in a manner that results in a conventional mode of operation of the computer system 1300 known to those in the relevant art. For example, the processor 1305 is coupled to the system bus 1304 using a connection 1318. Likewise, the memory 1306 and optical disk drive 1312 are coupled to the system bus 1304 by connections 1319. Examples of computers on which the described arrangements can be practised include IBM-PC's and compatibles, Sun Sparcstations, Apple Mac™ or like computer systems.

Figure 4:
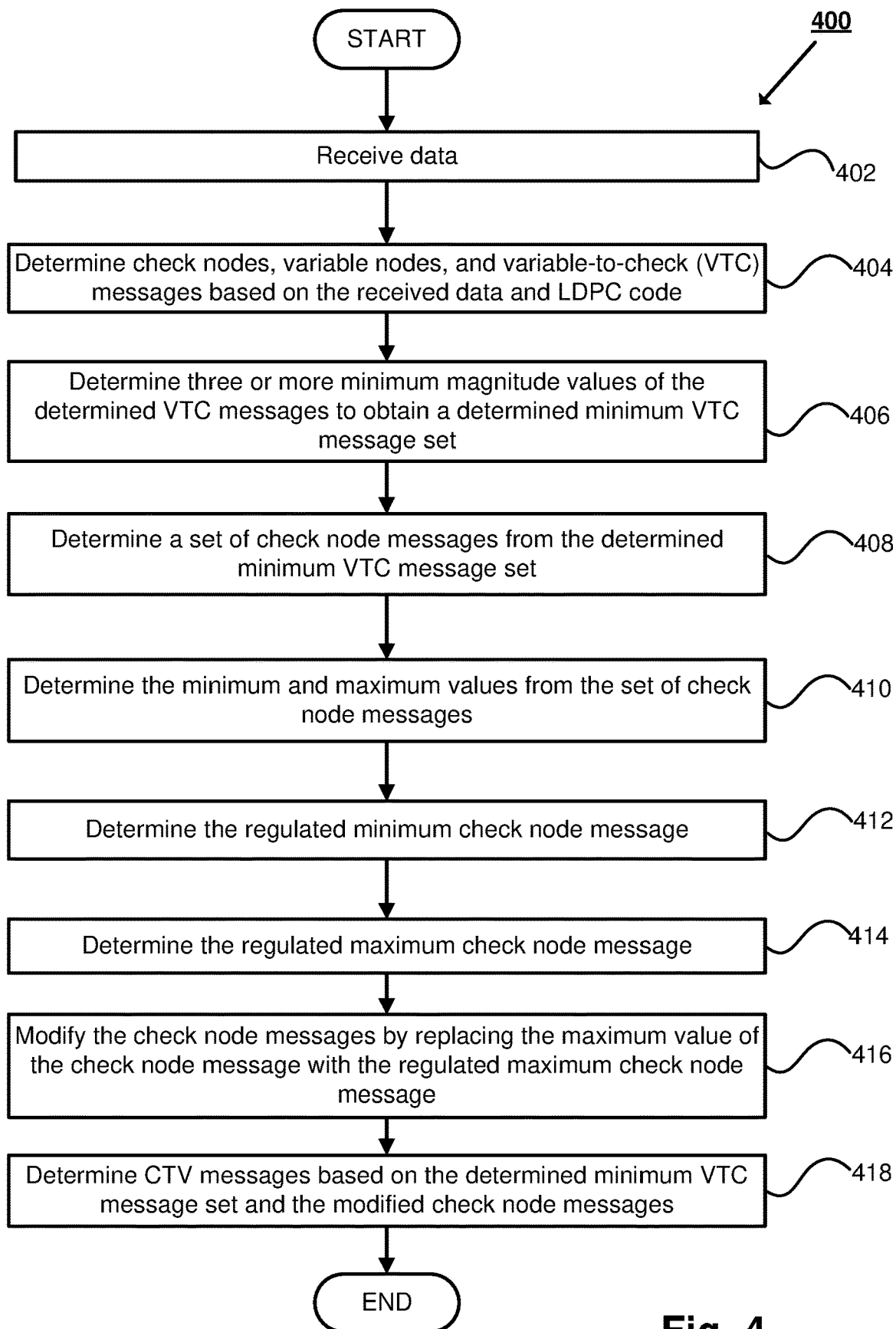
FIG. 4 is a flow diagram of a method of generating CTV messages according to the present disclosure.

The method of generating CTV messages $E_{j,i}$ may be implemented using the computer system 1300 wherein the processes of FIG. 4, to be described, may be implemented as one or more software application programs 1333 executable within the computer system 1300. In particular, the steps of the method of generating CTV messages $E_{j,i}$ are effected by instructions 1331 (see FIG. 6B) in the software 1333 that are carried out within the computer system 1300. The software instructions 1331 may be formed as one or more code modules, each for performing one or more particular tasks. The software may also be divided into two separate parts, in which a first part and the corresponding code modules perform the generation of CTV messages $E_{j,i}$ method and a second part and the corresponding code modules manage a user interface between the first part and the user.

The software may be stored in a computer readable medium, including the storage devices described below, for example. The software is loaded into the computer system 1300 from the computer readable medium, and then executed by the computer system 1300. A computer readable medium having such software or computer program recorded on the computer readable medium is a computer program product. The use of the computer program product in the computer system 1300 preferably effects an advantageous apparatus for generating CTV messages $E_{j,i}$ and decoding LDPC codes.

The software 1333 is typically stored in the HDD 1310 or the memory 1306. The software is loaded into the computer system 1300 from a computer readable medium, and executed by the computer system 1300. Thus, for example, the software 1333 may be stored on an optically readable disk storage medium (e.g., CD-ROM) 1325 that is read by the optical disk drive 1312. A computer readable medium having such software or computer program recorded on it is a computer program product. The use of the computer program product in the computer system 1300 preferably effects an apparatus for generating CTV messages $E_{j,i}$ and decoding LDPC codes.

In some instances, the application programs 1333 may be supplied to the user encoded on one or more CD-ROMs 1325 and read via the corresponding drive 1312, or alternatively may be read by the user from the networks 1320 or 1322. Still further, the software can also be loaded into the computer system 1300 from other computer readable media. Computer readable storage media refers to any non-transitory tangible storage medium that provides recorded instructions and/or data to the computer system 1300 for execution and/or processing. Examples of such storage media include floppy disks, magnetic tape, CD-ROM, DVD, Blu-ray™ Disc, a hard disk drive, a ROM or integrated circuit, USB memory, a magneto-optical disk, or a computer readable card such as a PCMCIA card and the like, whether or not such devices are internal or external of the computer module 1301. Examples of transitory or non-tangible computer readable transmission media that may also participate in the provision of software, application programs, instructions and/or data to the computer module 1301 include radio or infra-red transmission channels as well as a network connection to another computer or networked device, and the Internet or Intranets including e-mail transmissions and information recorded on Websites and the like.

The second part of the application programs 1333 and the corresponding code modules mentioned above may be executed to implement one or more graphical user interfaces (GUIs) to be rendered or otherwise represented upon the display 1314. Through manipulation of typically the keyboard 1302 and the mouse 1303, a user of the computer system 1300 and the application may manipulate the interface in a functionally adaptable manner to provide controlling commands and/or input to the applications associated with the GUI(s). Other forms of functionally adaptable user interfaces may also be implemented, such as an audio interface utilizing speech prompts output via the loudspeakers 1317 and user voice commands input via the microphone 1380. For example, certain parameters (e.g., the parameters k and l) of the method for generating CTV messages $E_{j,i}$ can be set by the user to adjust the accuracy in detecting and correcting errors in the received data.

FIG. 6B is a detailed schematic block diagram of the processor 1305 and a "memory" 1334. The memory 1334 represents a logical aggregation of all the memory modules (including the HDD 1309 and semiconductor memory 1306) that can be accessed by the computer module 1301 in FIG. 6A.

When the computer module 1301 is initially powered up, a power-on self-test (POST) program 1350 executes. The POST program 1350 is typically stored in a ROM 1349 of the semiconductor memory 1306 of FIG. 6A. A hardware device such as the ROM 1349 storing software is sometimes referred to as firmware. The POST program 1350 examines hardware within the computer module 1301 to ensure proper functioning and typically checks the processor 1305, the memory 1334 (1309, 1306), and a basic input-output systems software (BIOS) module 1351, also typically stored in the ROM 1349, for correct operation. Once the POST program 1350 has run successfully, the BIOS 1351 activates the hard disk drive 1310 of FIG. 6A. Activation of the hard disk drive 1310 causes a bootstrap loader program 1352 that is resident on the hard disk drive 1310 to execute via the processor 1305. This loads an operating system 1353 into the RAM memory 1306, upon which the operating system 1353 commences operation. The operating system 1353 is a system level application, executable by the processor 1305, to fulfil various high level functions, including processor management, memory management, device management, storage management, software application interface, and generic user interface.

The operating system 1353 manages the memory 1334 (1309, 1306) to ensure that each process or application running on the computer module 1301 has sufficient memory in which to execute without colliding with memory allocated to another process. Furthermore, the different types of memory available in the system 1300 of FIG. 6A must be used properly so that each process can run effectively. Accordingly, the aggregated memory 1334 is not intended to illustrate how particular segments of memory are allocated (unless otherwise stated), but rather to provide a general view of the memory accessible by the computer system 1300 and how such is used.

As shown in FIG. 6B, the processor 1305 includes a number of functional modules including a control unit 1339, an arithmetic logic unit (ALU) 1340, and a local or internal memory 1348, sometimes called a cache memory. The cache memory 1348 typically includes a number of storage registers 1344-1346 in a register section. One or more internal busses 1341 functionally interconnect these functional modules. The processor 1305 typically also has one or more interfaces 1342 for communicating with external devices via the system bus 1304, using a connection 1318. The memory 1334 is coupled to the bus 1304 using a connection 1319.

The application program 1333 includes a sequence of instructions 1331 that may include conditional branch and loop instructions. The program 1333 may also include data 1332 which is used in execution of the program 1333. The instructions 1331 and the data 1332 are stored in memory locations 1328, 1329, 1330 and 1335, 1336, 1337, respectively. Depending upon the relative size of the instructions 1331 and the memory locations 1328-1330, a particular instruction may be stored in a single memory location as depicted by the instruction shown in the memory location 1330. Alternately, an instruction may be segmented into a number of parts each of which is stored in a separate memory location, as depicted by the instruction segments shown in the memory locations 1328 and 1329.

In general, the processor 1305 is given a set of instructions which are executed therein. The processor 1305 waits for a subsequent input, to which the processor 1305 reacts to by executing another set of instructions. Each input may be provided from one or more of a number of sources, including data generated by one or more of the input devices 1302, 1303, data received from an external source across one of the networks 1320, 1302, data retrieved from one of the storage devices 1306, 1309 or data retrieved from a storage medium 1325 inserted into the corresponding reader 1312, all depicted in FIG. 6A. The execution of a set of the instructions may in some cases result in output of data. Execution may also involve storing data or variables to the memory 1334.

The disclosed CTV messages $E_{j,i}$ generation method uses input variables 1354, which are stored in the memory 1334 in corresponding memory locations 1355, 1356, 1357. The disclosed arrangements produce output variables 1361, which are stored in the memory 1334 in corresponding memory locations 1362, 1363, 1364. Intermediate variables 1358 may be stored in memory locations 1359, 1360, 1366 and 1367.

Referring to the processor 1305 of FIG. 6B, the registers 1344, 1345, 1346, the arithmetic logic unit (ALU) 1340, and the control unit 1339 work together to perform sequences of micro-operations needed to perform "fetch, decode, and execute" cycles for every instruction in the instruction set making up the program 1333. Each fetch, decode, and execute cycle comprises:

a fetch operation, which fetches or reads an instruction 1331 from a memory location 1328, 1329, 1330;

a decode operation in which the control unit 1339 determines which instruction has been fetched; and an execute operation in which the control unit 1339 and/or the ALU 1340 execute the instruction.

Thereafter, a further fetch, decode, and execute cycle for the next instruction may be executed. Similarly, a store cycle may be performed by which the control unit 1339 stores or writes a value to a memory location 1332.

Each step or sub-process in the processes of FIG. 4 is associated with one or more segments of the program 1333 and is performed by the register section 1344, 1345, 1347, the ALU 1340, and the control unit 1339 in the processor 1305 working together to perform the fetch, decode, and execute cycles for every instruction in the instruction set for the noted segments of the program 1333.

The method of generating CTV messages $E_{j,i}$ may alternatively be implemented in dedicated hardware such as one or more integrated circuits performing the functions or sub functions of the method shown in FIG. 4. Such dedicated hardware may include FPGAs, graphic processors, digital signal processors, or one or more microprocessors and associated memories.

Decoding Method

Figure 1B:
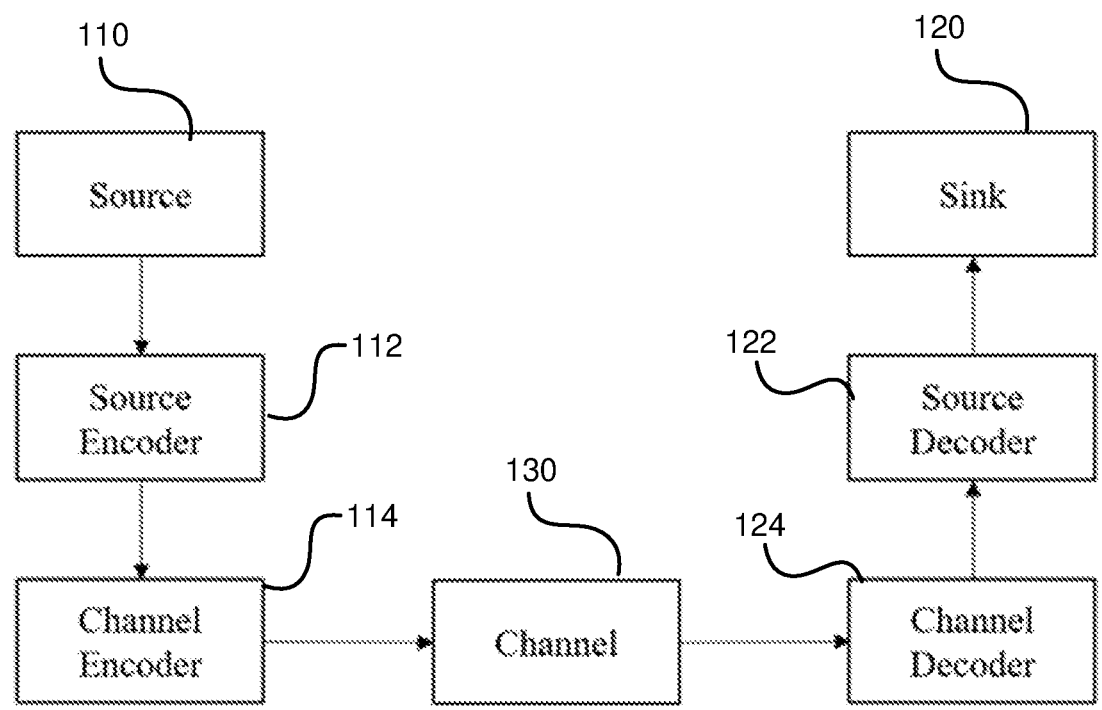
FIG. 1B shows the encoding and decoding performed at the source and the sink of FIG. 1A to correct errors introduced during digital communication.
Figures 2A, 2B:
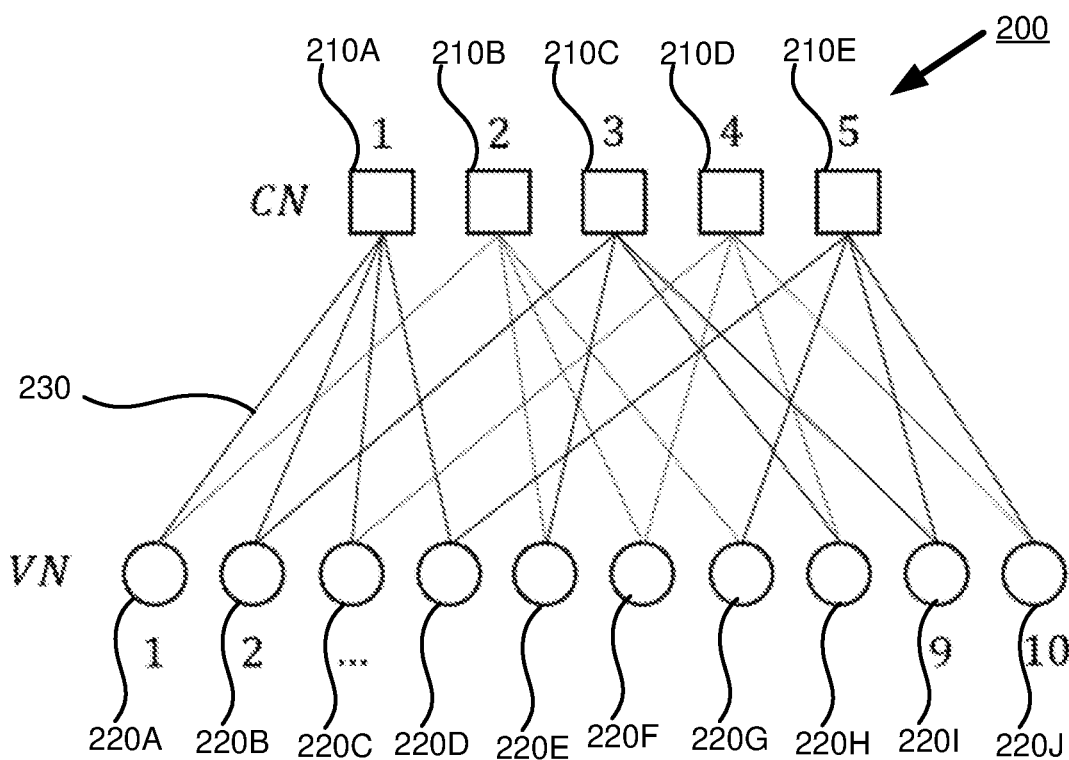
FIG. 2A shows an example matrix H of LDPC codes used in the decoding of FIG. 1B.
FIG. 2B shows a Tanner graph corresponding to the example matrix H of FIG. 2A.
Figure 3:
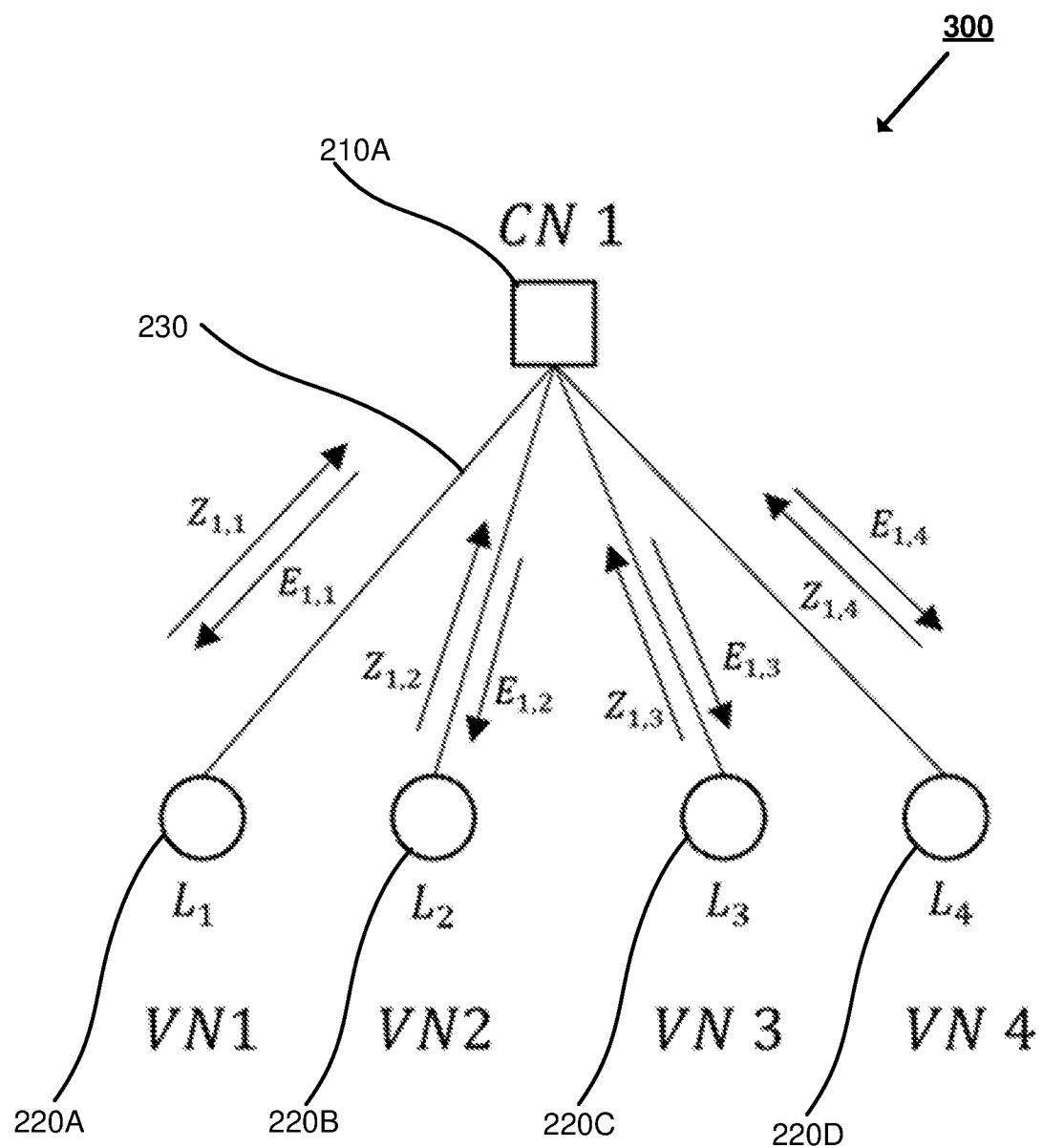
FIG. 3 shows an example Tanner graph for an example of data and matrix H.

FIG. 4 shows a flow diagram of a method 400 of generating CTV messages $E_{j,i}$. The method 400 is implemented as one or more software application programs 1333 executable within the computer system 1300 (described above in relation to FIGS. 6A and 6B). The method 400 is executed by the channel decoder 124 (see FIG. 1B) to generate CTV messages $E_{j,i}$ and decode LDPC codes.

The method 400 commences at step 402 by receiving data from the channel 130. The method 400 then proceeds from step 402 to step 404.

In step 404, the method 400 determines check nodes 210, variable nodes 220, and VTC messages $Z_{j,i}$ from the received data and LDPC code. As described hereinbefore, the received data includes signal $y_i$ (where i=1 to n). The signal $y_i$ is used to calculate the corresponding LLR $r_i$. Each of the LLR $r_i$ is then assigned to a variable node 220. The variable nodes 220 are then connected to one or more check nodes 210 according to a matrix H of the LDPC code.

The VTC messages $Z_{j,i}$ are then calculated using the equation $Z_{j,i} = r_i + \Sigma_{j' \in A_i, j' \neq j} E_{j',i}$ (this is the same equation recited above for calculating VTC messages $Z_{j,i}$). At the start of the decoding process, the initial CTV messages $E_{j',i}$ are zero.

The total number of VTC messages $Z_{j,i}$ is based on the number of the element 1 in the matrix H of the LDPC code. The total number of VTC messages $Z_{j,i}$ of each row of H is represented by $d_c$, (which is also the degree of each check node 210).

The method 400 then proceeds from step 404 to step 406.

In step 406, the method 400 calculates three or more minimum magnitude values of the determined VTC messages $Z_{j,i}$ to obtain a determined minimum VTC message set $m = \{m_1, m_2, \ldots, m_k\}$. The number of minimum magnitude values of the VTC messages $Z_{j,i}$ to be determined is set by the parameter k, where $3 \leq k \leq d_c$ and $d_c$ is the total number of VTC messages $Z_{j,i}$ of each check node 210. The parameter k is set by a user during programming of the method 400. In one alternative arrangement, the parameter k is set by a user by using one of the input devices of the computer system 1300.

The method 400 proceeds from step 406 to step 408.

In step 408, the method 400 determines a set of check node messages $M = \{M_1, M_2, \ldots, M_l\}$, from the determined minimum VTC message set m, where $3 \leq l \leq k+1$. The parameter l is set by a user during programming of the method 400. In one alternative arrangement, the parameter l is set by a user by using one of the input devices of the computer system 1300.

The first l–1 messages of the check node message set M is calculated using the equation:

$$M_t = U(\{m_{t'} | t' = 1, 2, 3, \ldots, k \text{ and } t' \neq t\}), t = 1, 2, 3, \ldots, l-1$$

The U function used in calculating the check node messages $M_t$ is an approximation function for recursive calculation. The general form of U function is expressed by:

$$U(a, b) = F(a, b)$$

$$U(a, b, c) = F(a, F(b, c))$$

$$U(a, b, c, d) = F(a, F(b, F(c, d)))$$

$$\ldots$$

Some examples of the F function are as follows:
Linear F equations:

$$F(a, b) = \begin{cases} \min(a, b) + 0.235 \cdot |a - b| - 0.7 & |a - b| \leq 2.97 \\ 0 & |a - b| > 2.97 \end{cases}$$

$$F(a, b) = \begin{cases} \min(a, b) + 0.69 \cdot |a - b| - 0.7 & |a - b| \leq 1.175 \\ \min(a, b) + 0.132 \cdot |a - b| - 0.445 & 1.175 < |a - b| \leq 3 \\ 0 & |a - b| > 3 \end{cases}$$

Non-linear F equations:
Jacobian logarithmic identity $$F(a, b) = \min(a, b) + \ln(1 + e^{-|a-b|}) - \ln(1 + e^{-\|a\|-|b\||})$$

Approximation of Jacobian logarithmic identity $$F(a, b) = \max\{\min(a, b) - \ln(1 + e^{-\|a\|-|b\||}), 0\}$$

The method 400 then proceeds from step 408 to step 410.

In step 410, the method 400 determines the minimum and maximum values from the first l−1 messages of the check node message set M. The minimum is stored as $M_{min}$ and the maximum is stored as $M_{max}$. The method 400 then proceeds from step 410 to step 412.

In step 412, the method 400 determines the value of regulated minimum check node message $M_l$ of the check node message set M using the equation:

$$M_l = P_{min}(M_{min}, d_c)$$

where $P_{min}(M_{min}, d_c) = \alpha_1 M_{min} + \beta_1 d_c$. $P_{min}$ is a linear or non-linear mathematical function that is regulated by the check node degree $d_c$. The parameters $\alpha_1$ and $\beta_1$ are constants that are adjustable to optimise the performance of the method 400.

The method 400 proceeds from step 412 to step 414.

In step 414, the method 400 determines the value of regulated maximum check node message W using the equation:

$$W = P_{max}(M_{max}, d_c),$$

where $P_{max}(M_{max}, d_c) = \alpha_2 M_{max} + \beta_2 d_c$. $P_{max}$ is a linear or non-linear mathematical function that is regulated by the check node degree $d_c$. The parameters $\alpha_2$ and $\beta_2$ are constants that are adjustable to optimise the performance of the method 400.

The method 400 proceeds from step 414 to step 416.

In step 416, the method 400 modifies the check node message set M by replacing the maximum value of the check node message set M with W (which is determined at step 414). The modified check node message set M' is therefore the check node message set M with its maximum value replaced with W. The method 400 proceeds from step 416 to step 418.

In step 418, the method 400 determines the CTV messages $E_{j,i}$ based on the determined minimum VTC message set m and the modified check node message set M' (as determined at steps 408 to 416). In particular, the modified check node message set M' is used to assign CTV messages $E_{j,i}$ based on the received VTC messages $Z_{j,i}$.

In a first step, the sign of each of the CTV messages $E_{j,i}$ is determined using the equation:

$$\theta_i = \prod_{1 \le i' \le d_c, i' \ne i} \text{sgn}(Z_{j,i'})$$

where $$\prod_{1 \le i' \le d_c, i' \ne i}$$

is the product of all the signs except the sign of the VTC message sent by variable node i and $\text{sgn}(Z_{j,i'})$ finds the sign for $Z_{j,i'}$ such that if $Z_{j,i'} \ge 0$ then $\text{sgn}(Z_{j,i'})=1$. Otherwise, $\text{sgn}(Z_{j,i'})=-1$.

Accordingly, the sign of the CTV message $E_{j,i}$ assigned to a variable node 220 is determined by the signs of all other VTC messages $Z_{j,i}$ except the sign of the VTC message sent by variable node i.

In a second step, the CTV messages $E_{j,i}$ are assigned according to the pseudocodes shown in Appendix A.

The second step can be referred to as a "compare and select" step. When assigning a CTV message $E_{j,i}$ to be sent to a variable node 220 (e.g., 220A), the check node 210 first compares the VTC message $Z_{j,i}$ received from this variable node 220 (i.e., 220A) with the set of minimum VTC messages m={$m_1, m_2, \ldots, m_{l-1}$}, to select which check node message in the modified check node message set M' to assign. If the absolute value of a VTC message $Z_{j,i}$ is equal to one of the minimum VTC messages m={$m_1, m_2, \ldots, m_{l-1}$}, then the corresponding check node message in the modified check node message set M' is assigned. For example, if the absolute value of a VTC message $Z_{j,i}$ is equal to $m_1$, then the CTV message $E_{j,i}$ is the corresponding check node message, $M_1$, in the modified check node message set M'. However if, the absolute value of a VTC message $Z_{j,i}$ is not equal to any one of the minimum VTC messages m={$m_1, m_2, \ldots, m_{l-1}$}, then $M_l$ is assigned. $M_l$ is the regulated minimum check node message determined at step 412.

Note: m={$m_1, m_2, \ldots, m_{l-1}$} is a subset of m={$m_1, m_2, \ldots, m_k$} as $3 \le l \le k+1$ The method 400 concludes at the conclusion of step 418.

Figure 5:
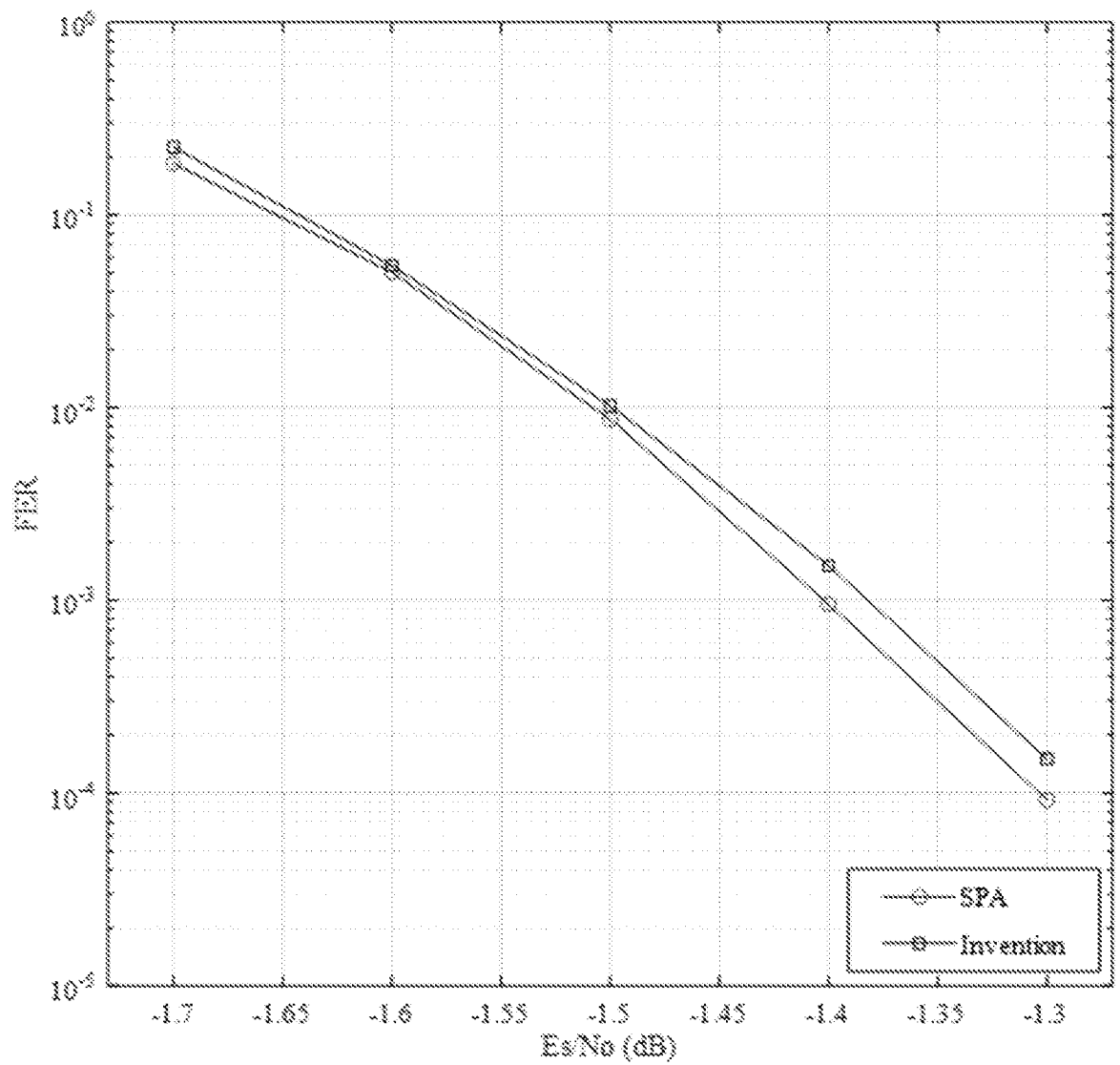
FIG. 5 shows a performance comparison between the decoding method of the present disclosure and SPA.

FIG. 5 shows a frame error rate (FER) performance comparison when decoding LDPC codes using SPA and the decoding method of the present disclosure. In particular, FIG. 5 compares the error correction performance of SPA and the LDPC decoder of the present disclosure. The x-axis indicates the signal-to-noise (SNR) or $E_s/N_0$ ratio of the channel. The y-axis indicates the Frame-error-rate (FER), which is the probability of failing to decode a frame. For example, if FER is equal to 0.2, which means the decoder will have 20% chance to decode a frame unsuccessfully or incorrectly. SPA and the LDPC decoder of the present disclosure achieve a FER of $10^{-2}$ at around SNR of −1.5 dB. The FER capability of the LDPC decoder of the present disclosure is therefore similar to the SPA, but much less complex and requires less computing resources.

INDUSTRIAL APPLICABILITY

The arrangements described are applicable to the computer and data processing industries and particularly for decoding of LDPC codes.

The foregoing describes only some embodiments of the present invention, and modifications and/or changes can be made thereto without departing from the scope and spirit of the invention, the embodiments being illustrative and not restrictive.

In the context of this specification, the word "comprising" means "including principally but not necessarily solely" or "having" or "including", and not "consisting only of". Variations of the word "comprising", such as "comprise" and "comprises" have correspondingly varied meanings.

APPENDIX A

```
For 1 ≤ j ≤ total number of check nodes,
    For 1 ≤ i ≤ d_c,
        If |Z_{j,i}| = m_1
            E_{j,i} = θ_{j,i} · M_1
        Else If |Z_{j,i}| = m_2
            E_{j,i} = θ_{j,i} · M_2
        .
        .
        .
        Else If |Z_{j,i}| = m_{l−2}
            E_{j,i} = θ_{j,i} · M_{l−2}
        Else If |Z_{j,i}| = m_{l−1}
            E_{j,i} = θ_{j,i} · M_{l−1}
        Else
            E_{j,i} = θ_{j,i} · M_l
        EndIf
    Endfor
Endfor
```

The invention claimed is:

1. A method of decoding Low-Density Parity-Check (LDPC) codes in received data, the method comprising:
   receiving the data transmitted via a channel;
   decoding the received data by a channel decoder, the decoding comprising:
   determining check nodes, variable nodes, and variable-to-check (VTC) messages based on the LDPC codes;
   determining three or more minimum magnitude values of the determined VTC messages to obtain a determined minimum VTC message set;
   determining a set of check node messages from the determined minimum VTC message set, wherein the determined set of check node messages and the determined minimum VTC message set are used to determine a set of check-to-variable (CTV) messages;
   determining a maximum value from the set of check node messages;
   determining a regulated maximum check node message;
   modifying the set of check node messages based on the regulated maximum check node message; and
   determining the set of CTV messages based on the modified check node messages; and
   providing the decoded data to a sink.

2. The method according to claim 1, further comprising:
   determining a minimum value from the set of check node messages.

3. The method according to claim 2, further comprising:
   determining a regulated minimum check node message used in the determination of the set of CTV messages.

4. The method according to claim 1, wherein the modification step includes replacing a maximum value of the set of check node messages with the determined regulated maximum check node message.

5. The method according to claim 1, wherein the determination of the set of CTV messages includes:
   comparing the VTC messages received by a check node with the determined minimum VTC message set; and
   assigning a value of the modified check node messages as a corresponding CTV message.

6. An apparatus configured for performing a method of decoding Low-Density Parity-Check (LDPC) codes in received data, the method comprising:
   receiving the data transmitted via a channel;
   decoding the received data by a channel decoder, the decoding comprising:
   determining check nodes, variable nodes, and variable-to-check (VTC) messages based on the LDPC codes;
   determining three or more minimum magnitude values of the determined VTC messages to obtain a determined minimum VTC message set;
   determining a set of check node messages from the determined minimum VTC message set, wherein the determined set of check node messages and the determined minimum VTC message set are used to determine a set of check-to-variable (CTV) messages;
   determining a maximum value from the set of check node messages;
   determining a regulated maximum check node message;
   modifying the set of check node messages based on the regulated maximum check node message; and
   determining the set of CTV messages based on the modified check node messages; and
   providing the decoded data to a sink.

7. The apparatus according to claim 6, wherein the method further comprises:
   determining a minimum value from the set of check node messages.

8. The apparatus according to claim 7, wherein the method further comprises:
   determining a regulated minimum check node message used in the determination of the set of CTV messages.

9. The apparatus according to claim 6, wherein the modification step includes replacing a maximum value of the set of check node messages with the determined regulated maximum check node message.

10. The apparatus according to claim 6, wherein the determination of the set of CTV messages includes:
    comparing the VTC messages received by a check node with the determined minimum VTC message set; and
    assigning a value of the modified check node messages as a corresponding CTV message.

11. A non-transitory computer program product comprising a method of decoding Low-Density Parity-Check (LDPC) codes in received data, the computer program product being readable by a processor to execute the method, the method comprising:
    receiving the data transmitted via a channel;
    decoding the received data by a channel decoder, the decoding comprising:
    determining check nodes, variable nodes, and variable-to-check (VTC) messages based on the LDPC codes;
    determining three or more minimum magnitude values of the determined VTC messages to obtain a determined minimum VTC message set;
    determining a set of check node messages from the determined minimum VTC message set, wherein the determined set of check node messages and the determined minimum VTC message set are used to determine a set of check-to-variable (CTV) messages;
    determining the maximum values from the set of check node messages;
    determining a regulated maximum check node message;
    modifying the set of check node messages based on the regulated maximum check node message; and
    determining the set of CTV messages based on the modified check node messages; and
    providing the decoded data to a sink.

12. The non-transitory computer program product according to claim 11, further comprising:
   determining a minimum value from the set of check node messages.

13. The non-transitory computer program product according to claim 12, further comprising:
   determining a regulated minimum check node message used in the determination of the set of CTV messages.

14. The non-transitory computer program product according to claim 11, wherein the modification step includes replacing a maximum value of the set of check node messages with the determined regulated maximum check node message.

15. The non-transitory computer program product according to claim 11, wherein the determination of the set of CTV messages includes:
   comparing the VTC messages received by a check node with the determined minimum VTC message set; and
   assigning a value of the modified check node messages as a corresponding CTV message.

* * * * *